United States Patent [19]

Momosaki

[11] 4,418,299
[45] Nov. 29, 1983

[54] FACE-SHEAR MODE QUARTZ CRYSTAL VIBRATORS AND METHOD OF MANUFACTURE

[75] Inventor: Eishi Momosaki, Owa Suwa, Japan

[73] Assignee: Kabushiki Kaisha Suwa Seikosha, Tokyo, Japan

[21] Appl. No.: 427,047

[22] Filed: Sep. 29, 1982

Related U.S. Application Data

[63] Continuation-in-part of Ser. No. 167,296, Jul. 10, 1980, abandoned, which is a continuation of Ser. No. 868,762, Jan. 12, 1978, abandoned.

[30] Foreign Application Priority Data

| Jan. 12, 1977 | [JP] | Japan | 52-2026 |
| Jan. 19, 1977 | [JP] | Japan | 52-4729 |
| Jan. 27, 1977 | [JP] | Japan | 52-8038 |
| Oct. 26, 1977 | [JP] | Japan | 52-128409 |

[51] Int. Cl.$^3$ .................................... H01L 41/08
[52] U.S. Cl. .................................... 310/361; 310/312; 310/366; 310/348; 310/352; 310/354; 310/346; 310/368
[58] Field of Search ............ 310/360, 361, 348, 312, 310/346, 366, 351–355, 367, 368

[56] References Cited

U.S. PATENT DOCUMENTS

| 2,277,245 | 3/1942 | Mason | 310/361 |
| 2,743,144 | 4/1956 | Bottom et al. | 310/361 |
| 3,072,806 | 1/1963 | Sogn | 310/361 |
| 4,035,674 | 7/1977 | Oguchi et al. | 310/361 X |
| 4,050,126 | 9/1977 | Ikeno et al. | 310/312 X |
| 4,071,797 | 1/1978 | Zumsteg et al. | 310/361 |
| 4,099,078 | 7/1978 | Shibata et al. | 310/361 |

OTHER PUBLICATIONS

*Handbook of Piezoelectric Crystals*, by Buchanan, WADC Technical Report, 54-248, Dec. 1954, pp. 44, 45.

Quartz Crystal Plate, Designated the GT, which Produces a Very Constant Frequency Over a Wide Temperature Range, by Mason, *Proceedings of the IRE*, May 1940, pp. 220–223.

*Primary Examiner*—Mark O. Budd
*Attorney, Agent, or Firm*—Blum, Kaplan, Friedman, Silberman & Beran

[57] ABSTRACT

A miniaturized face-shear mode quartz crystal vibrator and method of manufacture is provided. The vibrator is formed from a Y-cut quartz crystal plate less than 500 μm thick which has been rotated between 45° to 55° about the X-axis. A plurality of vibrators are formed by depositing a thin metallic film on the two opposed planar surfaces of the plate, selectively etching portions of the metallic films and dissolving the uncoated portions of the plate. The metallic films become the vibrator electrode.

10 Claims, 15 Drawing Figures

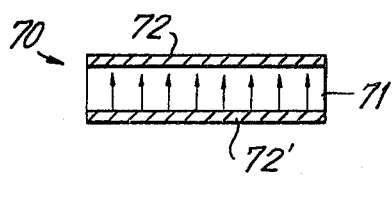
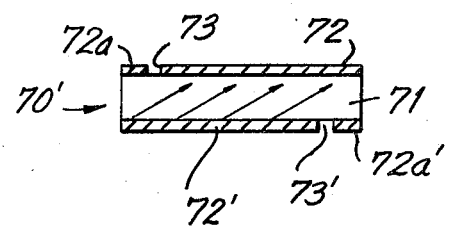
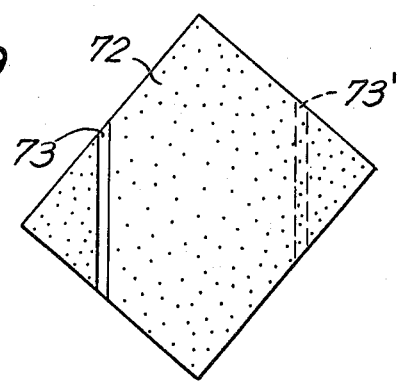
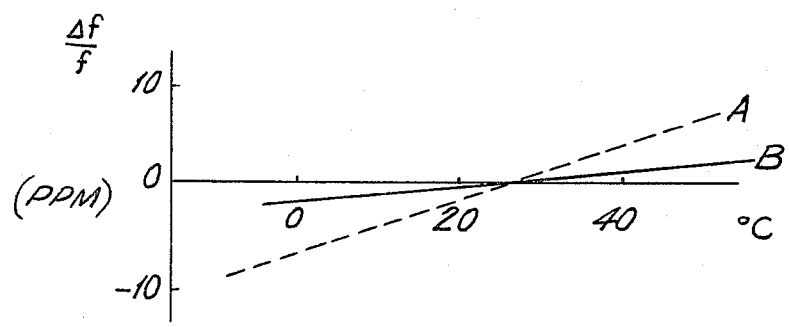

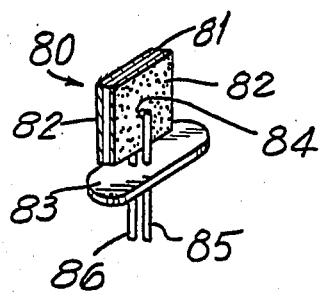
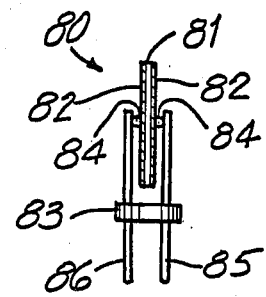
FIG.11    FIG.12
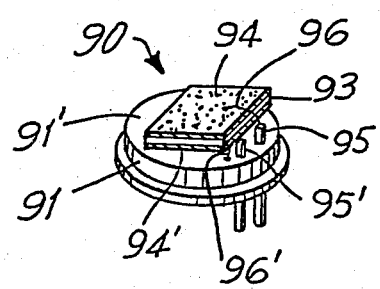
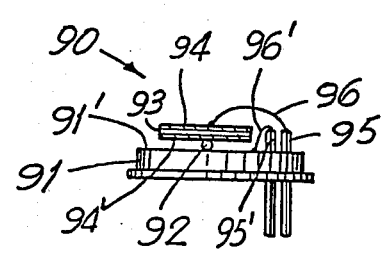
FIG.13    FIG.14

FACE-SHEAR MODE QUARTZ CRYSTAL VIBRATORS AND METHOD OF MANUFACTURE

CROSS-REFERENCE TO RELATED APPLICATIONS

This application is a continuation-in-part application of copending application Ser. No. 167,296, filed on July 10, 1980 now abandoned, which was a continuation application of application Ser. No. 868,762, filed on Jan. 12, 1978, and now abandoned.

BACKGROUND OF THE INVENTION

This invention relates generally to a quartz crystal vibrator and method of manufacture, and particularly to a miniaturized face-shear mode quartz crystal vibrator and method of manufacture. Thickness-shear mode quartz crystal vibrators, such as the AT-cut quartz crystal vibrator, currently are drawing attention in an effort to keep up with the state of the art in providing accuracy to a quartz crystal timepiece. Time accuracy has been much approved by using AT-cut quartz crystal vibrators, however, they have the following shortcomings despite fairly constant frequency over a wide temperature range.

Miniaturization of the AT-cut quartz crystal vibrator is difficult, the resonant frequency is in the MHz zone which is extremely high and power consumption is high. Additionally, it has been difficult to mass product the AT-cut quartz crystal vibrator having consistent improved time accuracy. Thus, these defects have prevented the AT-cut quartz crystal vibrator from being put into widespread use despite its stable and accurate frequency. Accordingly, it is desirable to provide a quartz crystal vibrator that overcomes the above-noted defects of the AT-cut quartz crystal vibrator and will provide a low cost quartz crystal vibrator having constant temperature-frequency characteristics for use in electronic timepieces.

SUMMARY OF THE INVENTION

Generally speaking, in accordance with the invention, an improved miniaturized face-shear mode quartz crystal vibrator having constant temperature-frequency characteristics and method of manufacture is provided. The quartz crystal vibrator is formed from a face-shear mode quartz crystal plate of a single crystal plate less than 500 μm thick. The quartz crystal plate is cut from a natural quartz crystal wherein the Y-cut plate is rotated about the X-axis from 45° to 55°.

A plurality of vibrators in accordance with the invention are formed by depositing a thin film of chromium across both opposed planar surfaces of the crystal plate and a thin film of gold is deposited thereon. The metallic layer is selectively removed by photo-etching in the desired shape of the vibrators and the coated plate is soaked in a hydrofluoric acid and ammonium fluoride solution to remove the unnecessary portions of the quartz crystal not covered with the chromium and gold films. The chromium and gold film remaining on the opposed surfaces of the plate forms the vibrator electrodes. In another embodiment of the invention, a quartz crystal vibrator is shaped by photo-etching to include holding portions. In a further embodiment of the invention, portions of the vibrator electrodes are selectively removed to adjust the frequency-temperature characteristics of the vibrator. In yet another embodiment of the invention the vibrator is supported by metallic balls.

Accordingly, it is an object of the invention to provide an improved quartz crystal vibrator.

Another object of the invention is to provide an improved face-shear mode quartz crystal vibrator.

A further object of the invention is to provide an improved face-shear mode quartz crystal vibrator formed from a Y-cut crystal plate rotated about the X-axis by 45° to 55°.

Still another object of the invention is to provide an improved face-shear mode quartz crystal vibrator integrally formed with holding portions.

Still a further object of the invention is to provide an improved face-shear mode quartz crystal vibrator wherein the frequency characteristics are adjusted by selectively removing a portion of surface electrodes.

Still a further object of the invention is to provide an improved face-shear mode quartz crystal vibrator bonded by metallic balls.

Another object of the invention is to provide an improved method of manufacture of a miniaturized face-shear mode quartz crystal vibrator.

Still other objects and advantages in the invention will in part be obvious and will in part be apparent from the specification.

The invention accordingly comprises the several steps and the relation of one or more of such steps with respect to each of the others, and the composition possessing the features, properties and the relation of constituents, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 8 is a cross-sectional views of the quartz crystal vibrator illustrated in FIG. 7;

FIG. 9 is a top plan view showing an electrode of the quartz crystal vibrator illustrated in FIG. 7;

FIG. 10 is a graphical representation illustrating the change in the frequency-temperature characteristics of the quartz crystal vibrator illustrated in FIG. 7;

FIG. 11 is a perspective view of a quartz crystal vibrator and improved holding members constructed and arranged in accordance with an embodiment of the invention;

FIG. 12 is a side elevational view of the quartz crystal vibrator illustrated in FIG. 11;

FIG. 13 is a perspective view of a quartz crystal vibrator and holding assembly constructed and arranged in accordance with a further embodiment of the invention; and FIG. 14 is a side elevational view of the quartz crystal vibrator and holding assembly illustrated in FIG. 13.

DESCRIPTION OF THE PREFERRED EMBODIMENTS

Figure 1:
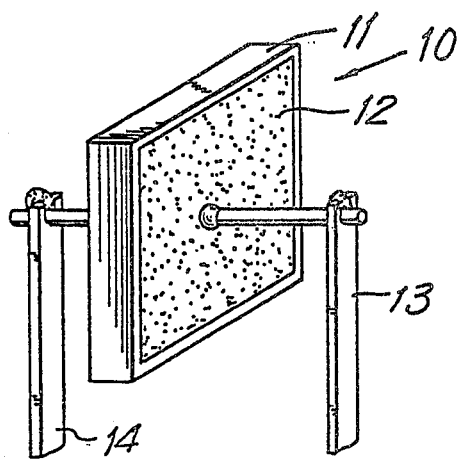
FIG. 1 is a perspective view of a conventional face-shear mode quartz crystal vibrator.

Referring now to FIG. 1, a conventional face-shear mode quartz crystal vibrator is shown generally as 10. Quartz crystal vibrator 10 is formed from a GT-cut crystal plate 11 about 40 mm square and about 30 mm thick and has an electrode 12 disposed on each of two opposed surfaces of plate 11. Vibrator 10 is supported by a pair of holders 13 and 14 which also serve as electrical leads for connecting quartz crystal vibrator 10 to an electrical circuit (not shown) for excitation in the face-shear mode. Vibrator 10 has excellent temperature-resonance frequency characteristics that are level across a normal temperature range. The resonance frequency of quartz crystal vibrator 10 is about 100 KHz.

In order to retain the excellent electrical characteristics of quartz crystal vibrator 10, it must be formed carefully from the natural quartz crystal. That is, in order to retain the excellent aging characteristics of resonance frequency and a high Q value, any forming process which may cause distortion in the vibrator must be avoided. For example, a diamond cutter cannot be used to cut quartz crystal plate 11, but rather a process must be used which does not distort the vibrator. In order to accomplish this, it is necessary to apply the lapping method. Inasmuch as quartz crystal vibrator 10 has six planar surfaces, it is necessary to employ the lapping process six times, or at least three times when two opposed surfaces are lapped simultaneously. Thus, it is difficult to manufacture such a vibrator inexpensively. As the ratio of the length and breath of the various sides effects the temperature-frequency characteristics and the resonance frequency depends upon the length of each in a GT-cut quartz crystal, extremely high tolerance in the shape and size during manufacturing of quartz crystal vibrator 10 imposes serious difficulty. Because of this, the characteristics of various vibrators manufactured in accordance with the lapping process vary considerably from vibrator to vibrator, thus making it difficult to mass produce a vibrator with consistently excellent electrical characteristics.

Figure 2:
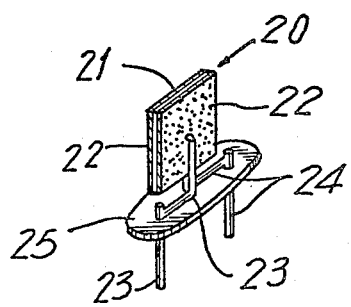
FIG. 2 is a perspective view of a miniaturized face-shear mode quartz crystal vibrator and holder constructed and arranged in accordance with an embodiment of the invention.

Referring now to FIG. 2, a miniaturized face-shear mode quartz crystal vibrator constructed and arranged in accordance with one embodiment of the invention is shown generally as 20. Quartz crystal vibrator 20 includes a thin quartz crystal vibrator plate 21 having two principal opposed substantially planar surfaces and four edge surfaces cut from a natural quartz crystal in accordance with the invention as will be described in detail below. A thin metallic electrode film 22 is disposed on each of the opposed planar surfaces of quartz crystal vibrator plate 21. A pair of support leads 23 and 24 for supporting quartz crystal vibrator 20 are mounted through a base 25 and act as electrical leads for connecting quartz crystal vibrator 20 to an electrical circuit (not shown).

Figure 3A:
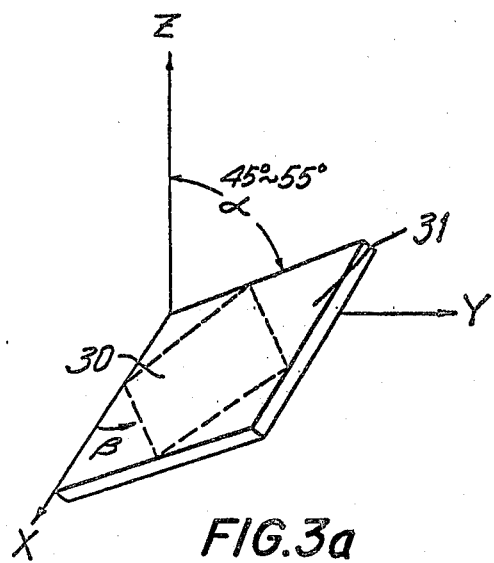
FIGS. 3a and 3b are illustrations of the top and bottom opposed planar surfaces, respectively, of a quartz crystal plate utilized in forming the quartz crystal vibrators in accordance with the invention.
Figure 3B:
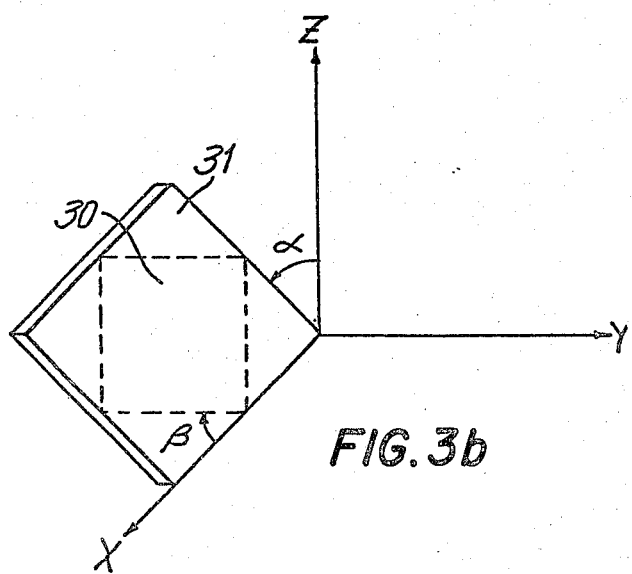

Referring to FIGS. 3a and 3b, X, Y and Z are the electrical, mechanical and optical axes, respectively, and illustrate the orientation of a GT-cut quartz crystal plate 31 cut from a natural quartz crystal and a quartz crystal plate 30 for forming the quartz crystal vibrators in accordance with the invention. FIG. 3a illustrates a first planar surface of quartz crystal plates 30 and 31 and FIG. 3b illustrates the opposed planar surfaces of the respective plates by like reference numerals. The quartz crystal plates are cut from a natural quartz crystal wherein the Y-cut plate is rotated about the X-axis by 45° to 55° and quartz crystal plate 30 is rotated a desired angle $\beta$ from the X-axis, preferably 45° as illustrated. Quartz crystal plate 30 is lapped and polished sufficiently after being cut and is finished into a thin quartz crystal plate for forming vibrators in accordance with the invention with a desired thickness, preferably less than 500 $\mu$m, while removing any distortion caused during the cutting process. A plurality of quartz crystal vibrators are formed in accordance with the invention from quartz crystal plate 30 by photo-etching and dissolving will be described in detail with respect to FIG. 4.

Figure 4:
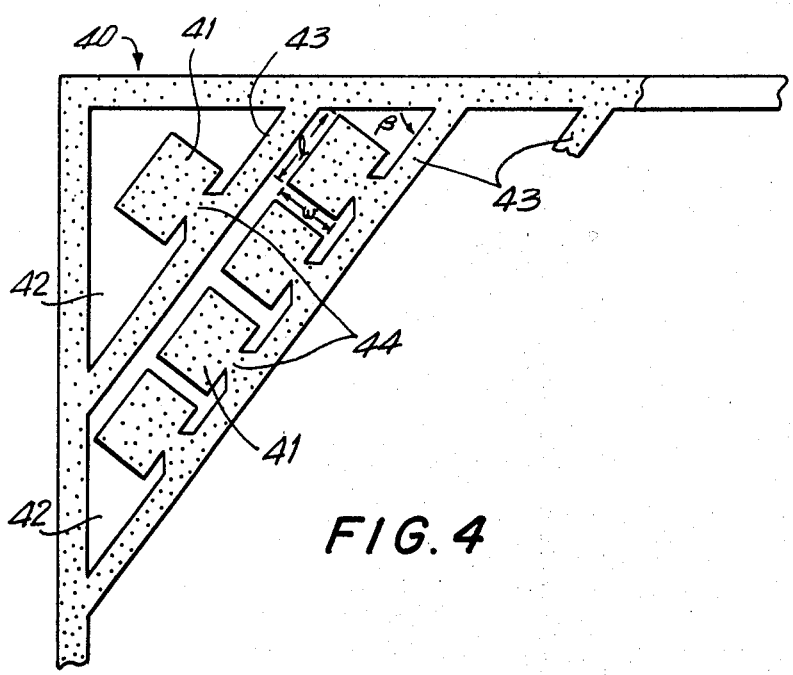
FIG. 4 is a plan view of a stage of manufacturing the quartz crystal vibrator illustrated in FIG. 2.

Referring now to FIG. 4, a thin chromium film is deposited across the opposed principal planar surfaces of a thin quartz crystal plate describe with respect to FIGS. 3a and 3b. A thin gold film is deposited across the chromium film. The thin metal film of chromium and gold is cut-out into the desired shape of a vibrator 41 by photo-etching. Unnecessary portions of the thin metal film in the regions shown generally as 42 are removed and the quartz crystal plate is soaked in a solution comprising hydrofluoric acid and ammonium fluoride for dissolving portions 42 of the quartz crystal plate not covered with the metallic films of chromium and gold. After the unnecessary portions of quartz crystal are dissolved a plurality of quartz crystal vibrators 41 having a long-side dimension or length l and a short-side dimension or width w are obtained, each joined to a runner portion 43 by a connecting portion 44 remaining from the quartz crystal plate.

In accordance with this embodiment of the invention, the thin metallic films of chromium and gold formed across each of the two principal opposed surfaces of the quartz crystal plate in the shape of vibrators 41 serve not only as masks for dissolving unnecessary portions 42 of the quartz crystal plate, but serve as electrodes of the vibrator afer vibrators 41 are formed. Individual quartz crystal vibrators 41 are separated from runner portions 44 by applying a weak force to connecting portions 44. In this embodiment of the invention, the shape of the electrodes and the shape of the vibrators are the same, however, it is clearly within the scope of the invention to form the vibrator wherein the shape of the electrodes differ from the shape of the vibrator. In this latter embodiment, the number of processing steps for forming the vibrator is increased.

The external shape of face-shear mode quartz crystal vibrators constructed and arranged in accordance with this embodiment of the invention may be freely selected. The rotation angle $\beta$ can be freely selected in the quartz crystal plate for varying the temperature-frequency characteristics of the vibrator. As electrodes 22 are formed simultaneously when forming the external form of the quartz crystal vibrator, the manufacturing steps are reduced substantially in number and it is possible to make the vibrator in a substantially miniaturized size. Moreover, as the vibrators can be formed with high accuracy when prepared in accordance with the invention, rotating angle $\beta$ can be freely selected and face-shear mode quartz crystal vibrators having consistently similar resonance frequency and temperature-frequency characteristics can be obtained. These quartz crystal vibrators are particularly useful in small electronic devices, such as a quartz crystal wristwatch.

Figure 5:
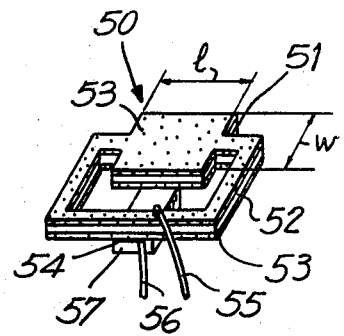
FIG. 5 is a perspective view of a miniaturized face-shear mode quartz crystal vibrator including holders constructed and arranged in accordance with another embodiment of the invention.
Figure 6:
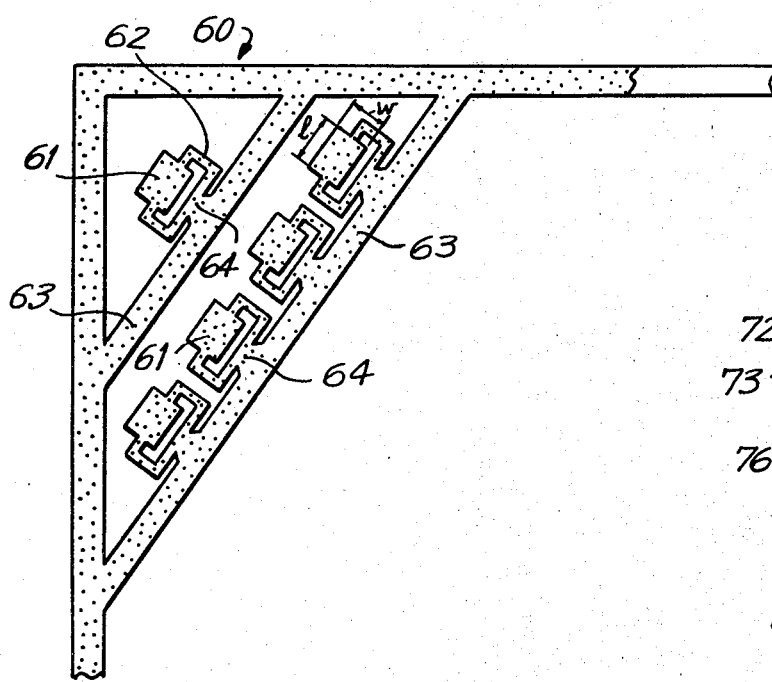
FIG. 6 is a plan view of a stage of manufacturing the quartz crystal vibrator illustrated in FIG. 5.

Referring now to FIG. 5, a face-shear mode quartz crystal vibrator constructed and arranged in accordance with another embodiment of the invention is shown generally as 50. Quartz crystal vibrator 50 includes a thin quartz crystal vibrator plate 51 having two principal opposed planar surfaces and four edge surfaces integrally formed with a coplanar integral support portion 52. Quartz crystal vibrator plate 51 is formed from a Y-cut quartz crystal plate rotated about the X-axis by 45° to 55°. A thin metallic film electrode 53 is disposed across each of the two opposed principal planar surfaces of quartz crystal vibrator plate 51 and support portion 52. Support portion 52 is mounted on a mounting block 57 by a quantity of solder 54. Quartz crystal vibrator 50 is connected electrically to a circuit (not shown) by a pair of leads 55 and 56 for excitation thereof when a voltage is applied across electrodes 53 for face-shear mode vibration of quartz crystal vibrator 50.

In general, the GT-cut quartz crystal vibrators prepared in accordance with the invention vibrate in the face-shear mode. This mode of vibration is effectively divided into two components—one propagated along the length and the other along the width. The vibrators have good temperature-frequency characteristics which are improved by selectively coupling the vibration in length wise direction l and the vibration in width direction w. In order to obtain a more stable frequency, the Q value in length wise direction l or width direction w decreases by increasing the dimension in length wise direction l or width dimension w. It is the frequency of vibration in the shorter or width dimension w which has a good Q value and is sought to be utilized.

The difference between frequency of vibration in length direction l and that in width direction w is only about 10 KHz. The miniaturized quartz crystal vibrators prepared in accordance with the invention, such as vibrator plates 41, 51, 61 and 71 are FIGS. 4-9 are between about 3.5 to 7 mm long by 3 to 6 mm wide and 80 to 200 $\mu$m thick. Such vibrators vibrate at frequencies of between about 500 KHz to 2 MKz. There is a danger of not being able to control the frequency of the vibration in length wise direction l or width direction w sufficiently in such a miniaturized quartz crystal vibrator. In such cases the Q value in length direction l deteriorates significantly. However, by providing a support arm or support portion 52 as shown in FIG. 5 unitarily formed with vibrator plate 51 in length wise direction l of vibrator plate 51, it is possible to obtain a stable frequency. This is in contrast to conventional vibrators wherein a support wire is connected to the nodal point of the vibrator as illustrated in FIG. 1. Such support is not utilized in the vibrators prepared in accordance with the invention as such a structure causes the Q value of the whole vibrator to deteriorate significantly when the vibrator is miniaturized. However, in accordance with the invention, support arm 52 is unitarily formed with vibrator plate 51 and is provided in length wise direction l of vibrator plate 51. In such a case, even if vibrator plate 51 is miniaturized even further, the Q value of the frequency is not lowered any further.

It has been determined experimentally that the long-side vibration need be suppressed to prevent oscillation at the residence frequency of the long side vibration to allow obtaining a stable vibrator characteristic. In other words, in order to stabilize the short-side vibration, it is necessary to obtain a sufficient vibrating Q value without decay of the short-side vibration. A support for the vibrator plate, such as integral support arm 52 formed in the same plane at plate 51 has been found to be an effective weight to satisfy the above-noted requirements. Accordingly, in the quartz crystal vibrators constructed and arranged in accordance with the invention, the short-side vibration occurs only in the quartz crystal vibrator plate and is not transmitted to the supporting portion. This improves the vibrating Q value and permits suppression of the long-side vibration to the required extent. In other words it is the short-side vibration which has the good frequency-temperature characteristics and the oscillator circuit is actually formed to generate the frequency of the short-side vibration. The long-side vibration is used only to improve the frequency-temperature characteristics.

A plurality of quartz crystal vibrators 50 are formed in the same manner as quartz crystal vibrator 20 illustrated in FIG. 2. For example, referring specifically to FIG. 6, a thin film of chromium is deposited on the opposed principal surfaces of a quartz crystal plate 30 described with respect to FIGS. 3a and 3b and a thin film of gold is deposited thereon. The metal film is selectively photoetched and crystal is dissolved to form a plurality of quartz crystal vibrator 61 having integral support portions 62, each connected to a runner 63 by a connecting portion 64 in the same manner as described with respect to FIG. 4. Quartz crystal vibrators 61 are removed by applying a weak force to connecting portions 64.

In this embodiment of the invention, as support portions 62 are formed simultaneously with vibrators 61, the loss of vibration caused by supporting a vibrator is small and alteration of the vibrating characteristics of vibrators formed in this manner are small. Additionally, as the support portion and the vibrating portion are integrally formed, the space required for the supporting portion is decreased and additional supporting wires are no longer necessary so that the overall size of the vibrator is decreased and the vibrator can be substantially miniaturized.

Figure 7:
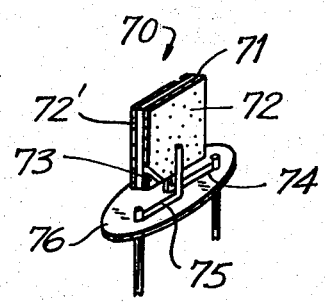
FIG. 7 is a perspective view of a miniaturized face-shear mode quartz crystal vibrator in accordance with a further embodiment of the invention.

Referring now to FIGS. 7-9, a quartz crystal vibrator shown generally as 70 having improved temperature-frequency characteristics includes a quartz crystal vibrator plate 71 formed from a thin quartz crystal plate 31 as illustrated in FIGS. 3a and 3b. Plate 71 has a thin metallic film electrode 72 and 72' on each of the two opposed planar surfaces of quartz crystal vibrator plate 71. Portions 73 and 73' are removed from electrodes 72 and 72', respectively. Quartz crystal vibrator 70 is mounted on base 76 by a pair of support leads 74 and 75 which also serve as electrical leads for connecting quartz crystal vibrator 72 to an electrical circuit (not shown). Quartz crystal vibrator 70 is formed in the same manner quartz crystal vibrator 20 illustrated in FIG. 2.

Regions 73 and 73' have been removed from electrodes 72 and 72' for varying the direction of electric field in quartz crystal vibrator plate 71 for adjusting the resonance frequency and temperature-frequency characteristic of quartz crystal vibrator 70. Regions 73 and 73' are removed by dissolving electrodes 72 and 72' by a laser beam for dividing metallic film 72 and 72' for forming metallic film regions 72a and 72a' which are not coupled electrically to electrode regions 72 and 72'. This reforming of the vibrator electrodes divides the metallic film on the planar surfaces into an electrode region and a non-electrode region for altering the direction of the electric field as shown in FIG. 8. Electrode removal may be performed after quartz crystal vibrator 70 is mounted as shown in FIG. 7 or may be removed when the vibrators are formed and connected in a state as illustrated in FIG. 4.

When quartz crystal vibrator 70 is formed in accordance with this embodiment of the invention, quartz crystal vibrator 70 supported by support leads 74 and 75 is excited by application of a voltage to support leads 74 and 75. The resonance frequency and the temperature-frequency characteristics of the vibrator are investigated. These characteristics may be selectively adjusted by evaporating electrode portions 73 and 73' as illustrated in FIG. 10.

Referring now to FIG. 10, the ordinate represents the frequency change in parts per million for a given frequency of vibration and the abscissor represents temperature in degrees centigrade. Line A illustrates the frequency stability of a quartz crystal vibrator formed in accordance with the invention, such as is illustrated in FIG. 2. After removal of selected portions of the electrodes to obtain a quartz crystal vibrator as illustrated in FIG. 7, the temperature-frequency characteristics of line B are considerably more stable over a broader temperature range than the quartz crystal vibrator represented by line A.

By constructing and arranging a quartz crystal vibrator in accordance with this embodiment of the invention, the adjustment to resonance frequency and temperature-frequency characteristics of the vibrator may be made after the vibrator is assembled. This adjustment may be performed when the vibrators are unassembled. This embodiment of the invention enables mass production of stable temperature-frequency quartz crystal vibrators.

Referring now to FIGS. 11 and 12, a quartz crystal vibrator shown generally as 80 includes a thin quartz crystal plate 81, as described with respect to FIGS. 3a and 3b, having a thin metallic film electrode 82 disposed across each of the two principal opposed planar surfaces thereof. Quartz crystal vibrator 80 is supported on a mounting plate 83 by a pair of gold balls 84 disposed between electrodes 82 and a pair of support leads 85 and 86. Quartz crystal vibrator 80 is formed from the same type thin quartz crystal plate and in the same manner as quartz crystal vibrator 20 illustrated in FIG. 2.

Support leads 85 and 86 are formed from an elastic metal material, such as phosphor bronze, berylium copper and nickel and the surfaces thereof are gilded. Gold balls 84 are bonded to electrodes 82 and support leads 85 and 86 by thermal compression by ball bonders which are used conventionally for IC wiring.

Referring now to FIGS. 13 and 14, a quartz crystal vibrator 90 is mounted on a plug 91 by a metallic ball 92. Quartz crystal vibrator 90 is of the type and formed in the manner described for vibrator 20 and includes a quartz crystal vibrator plate 93 and thin metallic electrode 94 disposed on the opposed principal surfaces in accordance with the invention. Plug 91 includes a pair of plug leads 95 and 95' insulatedly mounted therein and an upper conductive surface 91'. A lead wire 96 is disposed between electrically connecting vibrator electrode 94 on the upper surface of quartz crystal vibrator plate 93 thereto. A second lead wire 96' is disposed between plug conductive surface 91' and plug lead 95' for electrically connecting electrode 94' to plug lead 95'. Metallic ball 92 is a gold ball bonded to electrode 94' and plug conductive surface 91' by thermal compression.

A quartz crystal vibrator constructed and arranged in accordance with this embodiment of the invention provides a miniature low cost vibrator. It is unnecessary to use solder for bonding the vibrator plate and the supporting member so that there is no variation of the vibrator characteristics caused by the scattering of solder. The area provided for bonding the quartz crystal plate and supporting member is determined by the metallic ball placed therebetween so that dimensional accuracy of the supporting member is no longer critical. In addition, by bonding the quartz crystal and the supporting member by thermal compression through metallic ball means the area required for bonding is small and the Q of the vibrator rises without being altered by bonding or the supporting member. Moreover, metallic ball means does not influence the resonance frequency of the vibrator. In addition, bonding is extremely strong through the metallic ball medium inasmuch as solder is not used, assembly operations can be automated and number of operational steps can be eliminated. Thus, the structure is simple so that a miniaturized vibrator can be obtained.

This latter embodiment of the invention has been described for a quartz crystal vibrator. However, it is within the scope of this invention to adapt these teachings to other piezoelectric vibrators.

Accordingly, face-shear mode or contour quartz crystal vibrators constructed and arranged in accordance with the invention may be inexpensively manufactured by processes suitable for mass production. The vibrators may be accurately manufactured, are subminiature in size and extremely accurate for use in small electronic devices, such as quartz crystal timepieces as well as various kinds of electronic instruments. The method of manufacture enables accurate mass production of a plurality of vibrators from a single plate of quartz crystal and at the same time provides the surface electrodes for the vibrators formed. This method enables formation of vibrators with integral support portions and the metallic ball bonding means enables mounting of the vibrators with little effect on the frequency characteristics of the vibrator. In addition, the resonance frequency and temperature-frequency characteristics of the vibrators constructed and arranged in accordance with the invention may be adjusted by removal of a portion of the surface electrodes either before or after the vibrator is mounted.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A miniaturized quartz crystal vibrator comprising a rectangular face-shear mode quartz crystal plate having a long-side and a short-side dimension, said plate cut from a single quartz crystal less than 500 μm thick having two opposed principal substantially planar surfaces and four edge surfaces and metallic film electrodes disposed on at least a portion of said opposed planar surfaces, said quartz crystal plate being a Y-cut rotated about the X-axis from 45° to 55° and further rotated an angle of 45° from the X-axis, said quartz crystal plate being formed with a pair of holding portions integrally extending from the two opposed short-side edge surface with said holding portion extending along the long-side of said vibrator for supporting said quartz crystal vibrator and metallic film electrodes disposed on said holding portions.

2. The quartz crystal vibrator of claim 1, wherein said electrodes comprise a thin film of chromium disposed on said planar surfaces and a thin film of gold disposed on said chromium film.

3. The miniaturized quartz crystal vibrator of claim 1, wherein said support portion is formed in the same plane as said crystal plate.

4. The quartz crystal vibrator of claim 3, wherein a portion of each said electrode on each said opposed planar surface has been selectively removed.

5. A miniaturized quartz crystal vibrator comprising a face-shear mode quartz crystal plate cut from a single quartz crystal less than 500 μm thick having two opposed principal substantially planar surfaces and metallic electrodes disposed on at least a portion of said opposed principal planar surfaces, said quartz crystal plate being a Y-cut rotated about the X-axis, and said quartz crystal vibrator including at least one conductive support member and metallic ball means bonded between said quartz crystal vibrator and said support member by thermo-compression.

6. The quartz crystal vibrator of claim 5, wherein said conductive support member is substantially planar and said metallic ball means is one gold ball bonded therebetween.

7. The quartz crystal vibrator of claim 5, wherein said metallic ball means is a gold ball.

8. The quartz crystal vibrator of claim 7, including two parallel support members formed as leads and two gold balls, said gold balls disposed and bonded to said electrodes disposed on said opposed planar surfaces of said quartz crystal plate and said support members.

9. A miniaturized quartz crystal vibrator comprising a face-shear mode quartz crystal plate cut from a single quartz crystal less than 500 μm thick having two opposed principal substantially planar surfaces and metallic thin films for forming electrodes deposited on at least a portion of said opposed principal planar surfaces, said quartz crystal plate being a Y-cut rotated about the X-axis from 45° to 55° and further rotated an angle of 45° from the X-axis and at least a portion of said metallic films selectively removed from each planar surface to form at least two isolated metallic film regions, a first electrode region and a second non-electrode on that surface to change the direction of the electric field of the vibrator for adjusting the temperature-frequency characteristics of said vibrator.

10. The quartz crystal vibrator of claim 9, wherein the portion of metallic film is selectively removed by evaporation with a laser beam.

* * * * *